United States Patent
Noël et al.

(10) Patent No.: US 11,946,857 B2
(45) Date of Patent: Apr. 2, 2024

(54) SYSTEM AND METHOD FOR FREQUENCY MATCHING A RESONANCE CAVITY TO A LIGHT SOURCE

(71) Applicant: Picomole Inc., Moncton (CA)

(72) Inventors: Sébastien Noël, Haut-Sheila (CA); Jean-François Bisson, Moncton (CA); Alexis Gauvin, Dieppe (CA); Alexandre Doucet, Dieppe (CA); Gisia Beydaghyan, Moncton (CA)

(73) Assignee: PICOMOLE INC., Moncton (CA)

( * ) Notice: Subject to any disclaimer, the term of this patent is extended or adjusted under 35 U.S.C. 154(b) by 350 days.

(21) Appl. No.: 16/984,740

(22) Filed: Aug. 4, 2020

(65) Prior Publication Data
US 2022/0045475 A1 Feb. 10, 2022

(51) Int. Cl.
| | | |
|---|---|---|
| *G01N 21/03* | (2006.01) | |
| *G01N 21/39* | (2006.01) | |
| *G01N 21/61* | (2006.01) | |
| *H01S 3/10* | (2006.01) | |
| *H01S 5/14* | (2006.01) | |
| H10N 30/20 | (2023.01) | |
| H10N 30/80 | (2023.01) | |

(52) U.S. Cl.
CPC ....... *G01N 21/0303* (2013.01); *G01N 21/031* (2013.01); *G01N 21/39* (2013.01); *G01N 21/61* (2013.01); *H01S 3/10* (2013.01); *H01S 5/141* (2013.01); H10N 30/20 (2023.02); H10N 30/802 (2023.02)

(58) Field of Classification Search
CPC ........ H01S 3/10; H01S 3/2232; H01S 3/2391; H01S 3/1303; H01S 3/005; H01S 3/0071; G01N 21/0303; G01N 21/031; G01N 21/39; G01N 21/61
See application file for complete search history.

(56) References Cited

U.S. PATENT DOCUMENTS

| | | | | |
|---|---|---|---|---|
| 4,726,071 A | * | 2/1988 | Jachowski | H03J 7/16 333/17.1 |
| 5,363,387 A | * | 11/1994 | Sinofsky | A61B 18/24 372/15 |
| 8,120,773 B2 | * | 2/2012 | Gohle | G01J 3/433 356/326 |
| 2012/0257218 A1 | * | 10/2012 | Pinel | G01J 3/26 356/614 |

FOREIGN PATENT DOCUMENTS

WO   WO-2009070849 A1 *  6/2009   .............. G01J 3/433

* cited by examiner

*Primary Examiner* — Rebecca C Bryant
(74) *Attorney, Agent, or Firm* — Smart & Biggar LP

(57) ABSTRACT

A method and system for frequency matching a resonant cavity is disclosed. Light is received in a resonant cavity having at least a first mirror and a second mirror defining a path along which light is reflected. At least the second mirror is actuatable to vary the length of the path of the resonant cavity. An intensity of the light exiting or reflecting from the resonant cavity is monitored, and an error correction is determined. The second mirror is actuated towards a pose relative to the first mirror at which a frequency of the light is in resonance with the length of the path. In this manner, the resonant cavity is frequency matched to the light to maintain the resonant cavity in resonance.

21 Claims, 7 Drawing Sheets

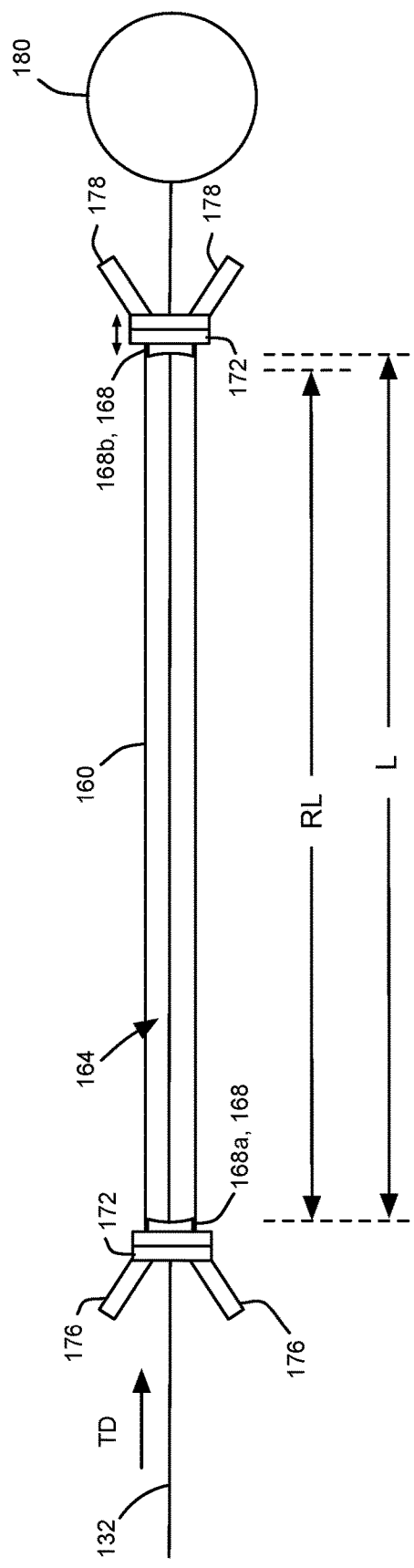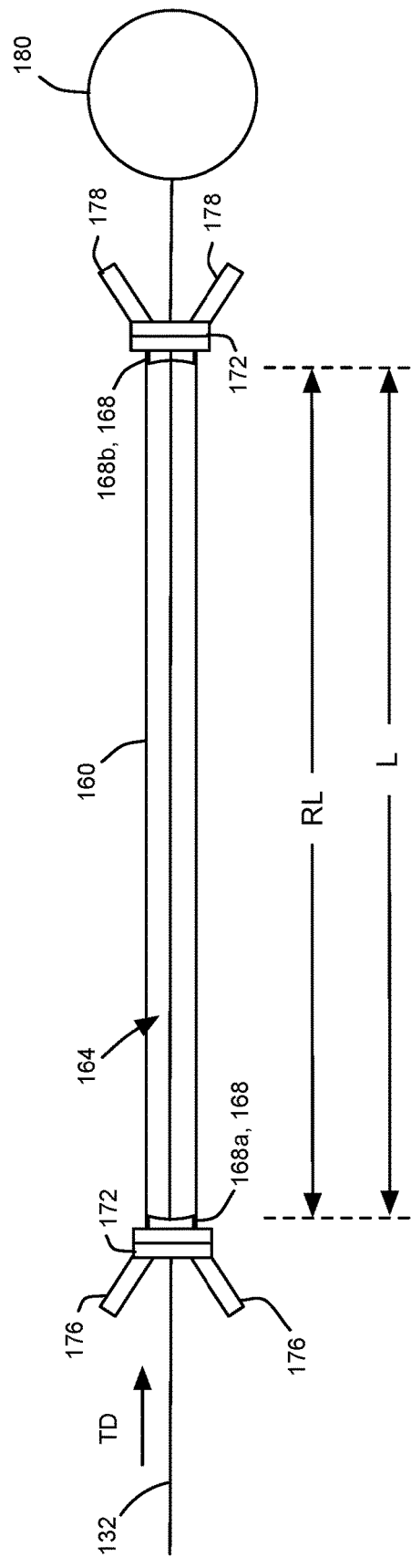

SYSTEM AND METHOD FOR FREQUENCY MATCHING A RESONANCE CAVITY TO A LIGHT SOURCE

FIELD

The specification relates generally to light analysis, and in particular to a system and method for frequency matching a resonant cavity to a light source.

BACKGROUND OF THE DISCLOSURE

Laser modulation in resonant cavity systems is known. A resonant cavity system conventionally includes a chamber (i.e., a cavity) that has two or more mirrors that are designed and positioned to reflect light repeatedly along a path between them. In some cases, the cavity can include two mirrors that are positioned at opposite ends of the cavity to reflect light between them along, effectively, a same path circuit. In other cases, the cavity can include a set of three or more mirrors that define a circuit along which light is reflected. One or more of the mirrors permit a degree of transmission of light therethrough to enable light to be introduced into the cavity.

Resonator cavity systems are conventionally configured with the mirrors at fixed positions to prevent misalignment that can lead to light not being reflected along the desired path, thereby inhibiting the build up of light therein.

A source of light in the form of a laser is used to introduce light into the cavity in such systems. As the cavity has a path with a fixed length, a wavelength (or frequency to which the wavelength is inversely related) of the laser is selected so that a multiple of the wavelength of the laser light corresponds to the path length of the cavity between the mirrors. Where the cavity only includes two mirrors between which light is reflected, the path includes a trip from a first mirror to a second mirror, and back from the second mirror to the first mirror. The distance between the two mirrors, referred to as the cavity length, is equal to half the length of the path. In this manner, there is constructive and not destructive interference of the light in the cavity and it is said that the laser is in resonance with the cavity.

The wavelength of the laser light can be unstable and vary during operation. As the cavity length is fixed, the wavelength of the laser is modulated to ensure that it remains in resonance with the cavity. This is traditionally done with a Fabry-Pérot interferometer or etalon that is interposed between the laser and the cavity, and by stabilizing the laser to the etalon, or via a Fabry-Pérot cavity.

FIG. 1 shows a conventional resonant cavity system 20 that is used to analyze gaseous samples. A laser 24 generates a laser beam 28. The laser 24 has an actuator and an output coupler that enable adjustment of the length of the laser cavity as well as an actuator to change the angle of grating at the back of the cavity, thereby changing its pitch to adjust which wavelengths it reflects. By both adjusting the length of the laser cavity and changing the angle of the grating, the laser can be tuned to a specific wavelength.

The laser beam 28 travels through a phase modulator 32 and a beam splitter 36 having a partial reflectance. A portion of the laser beam 28 passes through the beam splitter 36 towards a resonance chamber 40 having a front mirror 44a through which the laser beam 28 enters and a rear mirror 44b at an opposite end of a cavity 48 from the front mirror 44a. A remainder of the laser beam 28 is deflected to a beam dump 52. The cavity 48 is a Fabry-Pérot cavity and acts to indicate if the frequency of the laser beam 28 corresponds with the length of the cavity 48 between the two mirrors 44a, 44b. When the laser beam 28 is out of resonance with the frequency of the laser beam 28, the mirror 44a is highly reflective, causing the majority of the light from the laser beam 28 to be reflected back towards the beam splitter 36. A portion of the laser beam 28 is deflected by the beam splitter 36 towards the photo-detector 56. The photo-detector 56 measures the intensity of the laser beam 28 deflected to it and transmits a corresponding signal to a mixer 60. A function generator 64 generates and transmits an oscillating signal to the phase modulator 32 and to a phase shifter 68. The phase shifter 68 shifts the phase of the oscillating signal generated by the function generator 64 and transmits the shifted oscillating signal to the mixer 60. The mixer 60 frequency mixes the signal from the photo-detector 56 to generate an unfiltered error signal that is then passed to a low-pass filter 64. The filtered signal from the low-pass filter 72 is then amplified by a servo amplifier 76 and the error signal is then fed back to the laser 24 to adjust its frequency. Small changes made in the frequency of the laser 24 enable the directionality of the error identified in the error signal to be determined.

When the frequency of the laser 24 is adjusted to match the length of the cavity 48, constructive interference occurs in the cavity 56 when the wavelength of the light entering the cavity is in resonance with the fixed cavity length. This constructive interference also reduces the external reflectivity of the front mirror 52a to the laser beam 28, thus enabling more light to enter into the cavity 56.

Such conventional resonant cavity systems have a number of limitations, however. By fixing the cavity length, the cavity is only compatible with lasers of certain wavelengths; that is, lasers for which the cavity length is a multiple of the half-wavelength thereof. Further, the phase modulator can become prohibitively expensive for certain wavelengths. In order to be compatible with certain wavelengths of light, such as mid-infrared ("mid-IR"), expensive materials such as germanium are needed for the phase modulator.

SUMMARY OF THE DISCLOSURE

In one aspect, there is provided a method for frequency matching a resonant cavity, comprising: receiving light in a resonant cavity, the resonant cavity having at least a first mirror and a second mirror defining a path along which light is reflected, one or both of the first mirror and the second mirror at least partially permitting light from the resonant cavity to pass therethrough, at least the second mirror being actuatable to vary the length of the path of the resonant cavity; monitoring an intensity of the light exiting or reflecting from the resonant cavity via the at least one of the first mirror and the second mirror; determining an error correction from the monitored intensity of the light from the resonant cavity; and actuating the second mirror towards a pose relative to the first mirror at which a frequency of the light is in resonance with the length of the path.

The first mirror can be positioned at a first end of the resonant cavity, the second mirror can be positioned at a second end of the resonant cavity, and the path can be defined between the first mirror and the second mirror.

The light can be infrared or near-infrared.

The second mirror can be actuated to move at least one of towards or away from the first mirror to determine a directionality of an error correction to be applied to the second mirror. The second mirror can be constantly actuated to alternatingly move towards and away from the first mirror to determine the error correction. The second mirror can be intermittently actuated to move at least one of towards and away from the first mirror to determine the error correction. The second mirror can be alternatingly unactuated when a ring-down event is occurring and oscillated in between ring-down events.

The method can further comprise receiving the light in the resonant cavity via the first mirror. The monitoring can be performed by a photosensor positioned to monitor light exiting the resonant cavity via the second mirror. The monitoring can be performed by a photosensor positioned to monitor light reflected from the first mirror and/or exiting the resonant cavity via the first mirror.

In another aspect, there is provided a system for frequency matching a resonant cavity, comprising: a resonant cavity having at least a first mirror and a second mirror defining a path along which light is reflected, one or both of the first mirror and the second mirror at least partially permitting light from the resonant cavity to pass therethrough, at least the second mirror being actuatable to vary the length of the path of the resonant cavity; a light intensity meter configured to monitor an intensity of the light exiting or reflecting from the resonant cavity via the at least one of the first mirror and the second mirror; a logic unit configured to determine an error correction from the intensity of the light monitored by the light intensity meter; and a mirror actuator system configured to actuate the second mirror, at least partially based on the error correction, towards a pose relative to the first mirror at which a frequency of the light is in resonance with the length of the path.

The mirror actuator system can include at least one piezo-electric actuator connected to the logic unit.

The first mirror can be positioned at a first end of the resonant cavity, the second mirror can be positioned at a second end of the resonant cavity, and the path can be defined between the first mirror and the second mirror.

The light can be infrared or near-infrared.

The second mirror can be actuated to move at least one of towards or away from the first mirror to determine a directionality of an error correction to be applied to the first mirror. The second mirror can be constantly actuated to alternatingly move towards and away from the first mirror to determine the error correction. The second mirror can be intermittently actuated to move at least one of towards and away from the first mirror to determine the error correction. The second mirror can be alternatingly unactuated when a ring-down event is occurring and oscillated in between ring-down events.

The system can further include a light system configured to deliver the light into the resonant cavity via the first mirror.

The system can further include a photosensor positioned to monitor light exiting the resonant cavity via the second mirror.

The system can further include a photosensor positioned to monitor light reflected from the first mirror and/or exiting the resonant cavity via the first mirror.

Other technical advantages may become readily apparent to one of ordinary skill in the art after review of the following figures and description.

BRIEF DESCRIPTIONS OF THE DRAWINGS

For a better understanding of the embodiment(s) described herein and to show more clearly how the embodiment(s) may be carried into effect, reference will now be made, by way of example only, to the accompanying drawings in which:

FIG. 5A shows oscillation of the rear cavity mirror of the resonant cavity system of FIG. 3 to determine an error correction;

FIG. 5B shows the rear cavity mirror having been actuated towards a pose at which the ring-down cavity of the resonant cavity system of FIG. 3 is frequency matched to the laser light;

Figure 1:
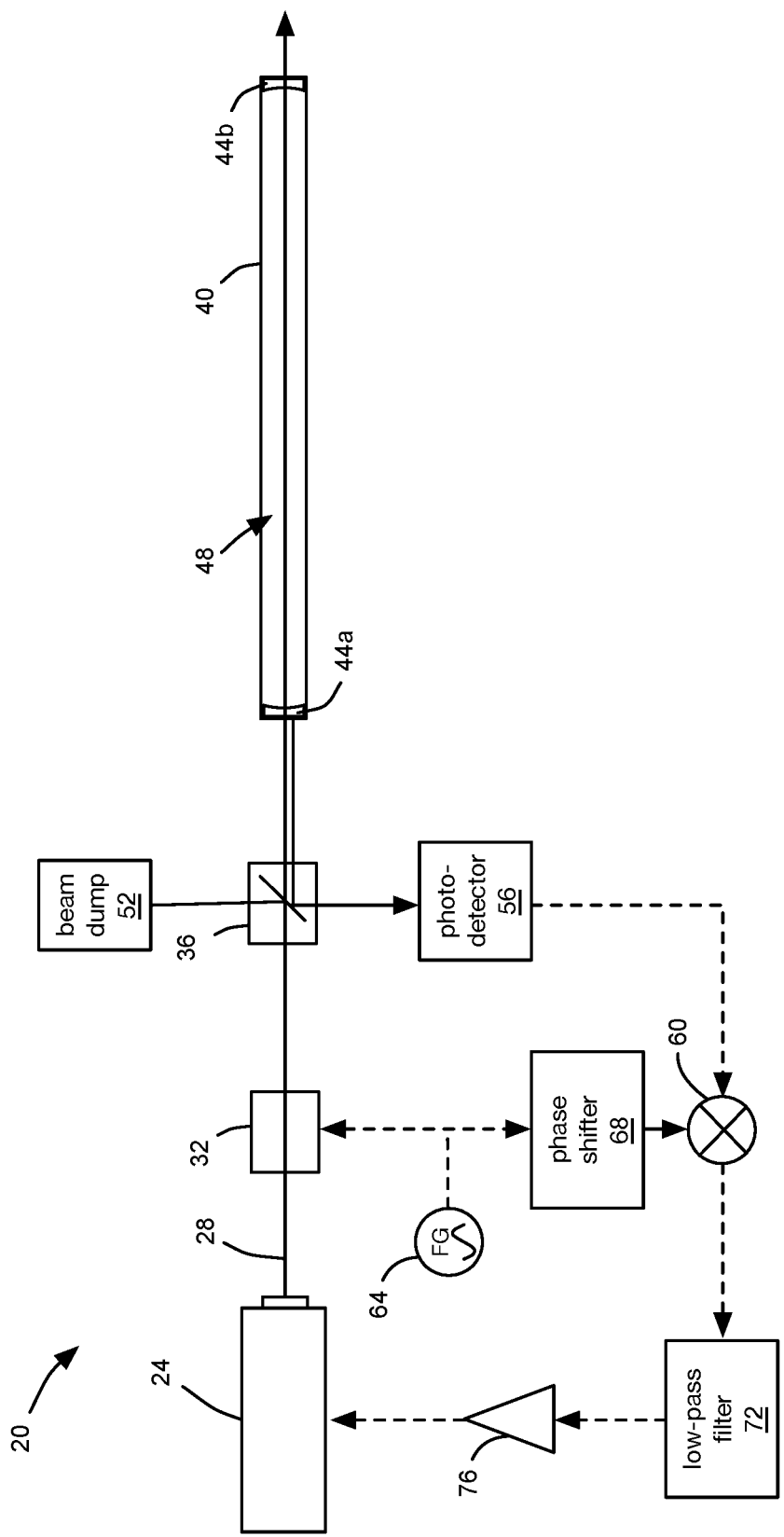
FIG. 1 is a schematic diagram of a prior art resonant cavity system.

Unless otherwise specifically noted, articles depicted in the drawings are not necessarily drawn to scale.

DETAILED DESCRIPTION

For simplicity and clarity of illustration, where considered appropriate, reference numerals may be repeated among the Figures to indicate corresponding or analogous elements. In addition, numerous specific details are set forth in order to provide a thorough understanding of the embodiment or embodiments described herein. However, it will be understood by those of ordinary skill in the art that the embodiments described herein may be practiced without these specific details. In other instances, well-known methods, procedures and components have not been described in detail so as not to obscure the embodiments described herein. It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Figure 2:
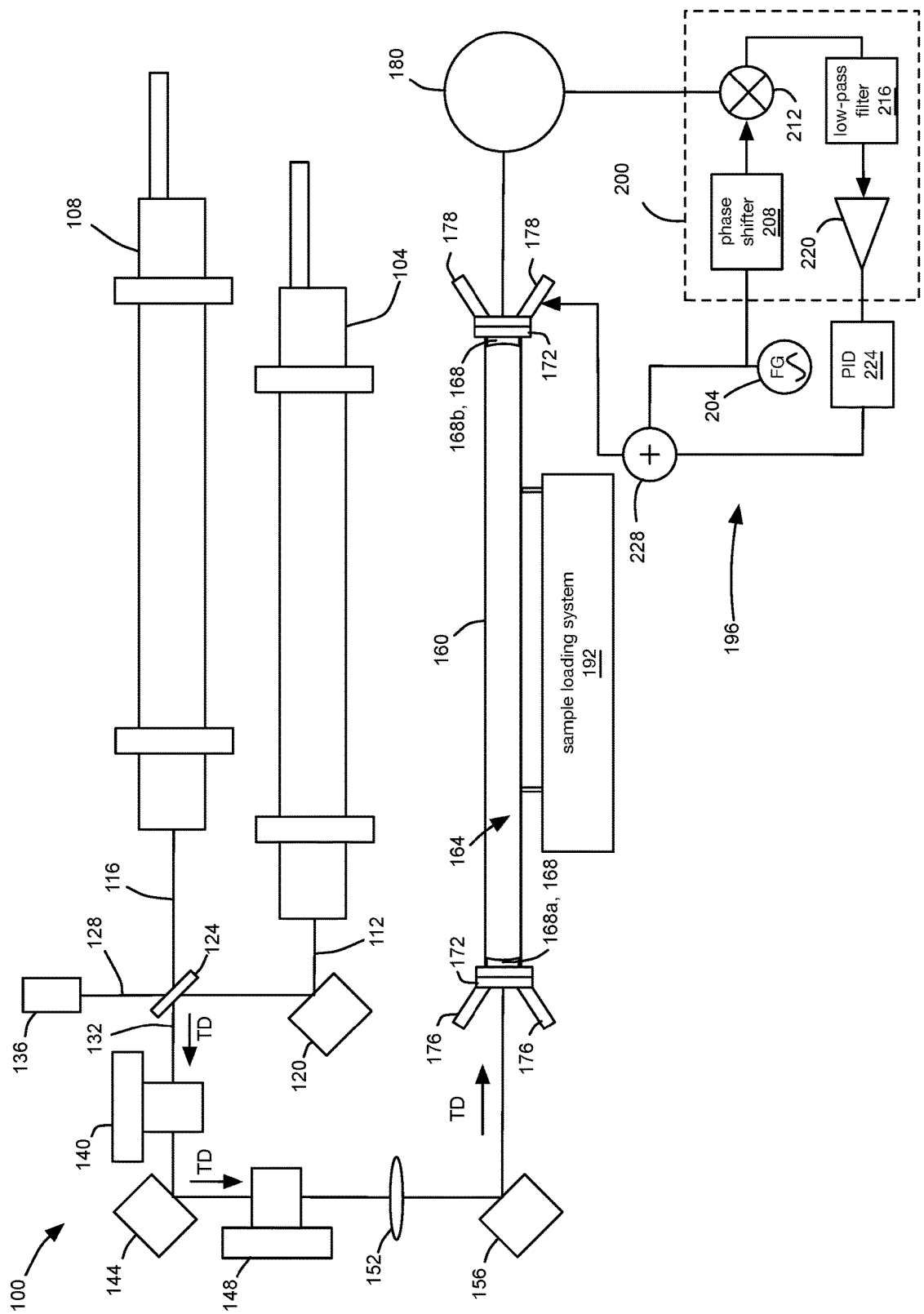
FIG. 2 is a schematic diagram of a resonant cavity system according to an embodiment.

Various components of a resonant cavity system in accordance with a particular embodiment are shown in FIG. 2. In the illustrated embodiment, the resonant cavity system is a cavity ring-down spectroscopy ("CRDS") system 100. A CO2 laser 104 and a carbon-13 O2 laser 108 are provided. The CO2 laser 104 and the carbon-13 O2 laser 108 are gas tube lasers that emit at a series of quasi-evenly-spaced, well-known frequencies that can be rapidly selected using an adjustable diffraction grating apparatus. Gas tube laser technology has a long history and is a stable and robust way of generating infrared radiation at precisely-known frequencies. Both the CO2 laser 104 and the carbon-13 O2 laser 108 emit light in the mid-IR spectrum.

Each of the CO2 laser 104 and the carbon-13 O2 laser 108 has an actuator and an output coupler that enable adjustment of the length of the laser cavity as well as an actuator to change the angle of grating at the back of the cavity, thereby changing its pitch to adjust which wavelengths it reflects. By both adjusting the length of the laser cavity and changing the angle of the grating, the laser can be very accurately tuned to a specific wavelength and desired mode quality.

The CO2 laser 104 produces a first laser beam 112, and the carbon-13 O2 laser 108 produces a second laser beam 116. Depending on the light frequency desired, either the CO2 laser 104 is tuned and generates the first laser beam 112 while the carbon-13 O2 laser 108 is detuned, or the carbon-13 O2 laser 108 is tuned and generates the second laser beam 116 while the CO2 laser 104 is detuned. In this manner, at most only one of the CO2 laser 104 and the carbon-13 O2 laser 108 outputs a beam at any particular time so that the first beam 112 and the second beam 116 are not combined simultaneously. Mid-infrared, and specifically long wavelength infrared, was chosen as the type of light as most volatile organic compounds absorb light in this range. As a result, multiple volatile organic compounds can be measured by a single system. CO2 lasers operate in this range and have sufficient power and linewidth narrowness for ring-down spectroscopy. Using two lasers adds to the range and number of available wavelengths that the CRDS system 100 can use to analyze gaseous samples.

The first laser beam 112 is redirected via a mirror 120 on an optic mount towards a beam splitter 124. The beam splitter 124 is partially reflective and partially transmissive, and splits each of the first laser beam 112 and the second laser beam 116 into two beams, a sampling beam 128, and a working beam 132 that has the same characteristics as the sampling beam 128 and can be of similar intensity as the sampling beam 128. The working beam 132 has a primary travel direction TD.

The sampling beam 128 is received by a fast infrared detector 136, which measures the amplitude and the beat frequency of the sampling beam 128 using an oscilloscope. The beat frequency can indicate the presence of higher order modes resulting from a less-than-optimal tuning of the CO2 laser 104 or the carbon-13 O2 laser 108. In response to the detection of an undesirable beat frequency, the corresponding laser 104 or 28 is tuned until the amplitude of the beat frequency is minimized or eliminated while maximizing the intensity. If the amplitude of the beat frequency cannot be reduced below an acceptable level, the laser can be tuned to a different wavelength.

The working beam 132 continues to a first optical modulator 140, which then deflects the working beam 132 to a mirror 144 on an optic mount. The mirror 144 redirects the light towards a second optical modulator 148 that, in turn, deflects the working beam 132 to a focusing lens 152. The optical modulators are used to control the intensity of the light beam generated by the laser. In the present embodiment, the first and second optical modulators 140, 148 are acousto-optic modulators ("AOMs") that attenuate the working beam 132. In other embodiments, the optical modulators could alternatively be electro-optic modulators. Further, while the CRDS system 100 is described as having two optical modulators, in other embodiments, the CRDS system can have fewer or a greater number of optical modulators, and the intensity of the working beam 132 can be attenuated via other means, such as shutters.

The working beam 132 deflected by the second optical modulator 148 is focused via a focusing lens 152. As the laser beam, and thus the working beam 132, travels from the CO2 laser 104 or the carbon-13 O2 laser 108, it continues to diverge. The focusing lens 152 focuses the working beam 132 back down.

A mirror 156 on an optic mount thereafter redirects the working beam 132 towards a ring-down chamber 160. The two mirrors 144, 156 extend the length of the path of the working beam 132.

Figure 3:
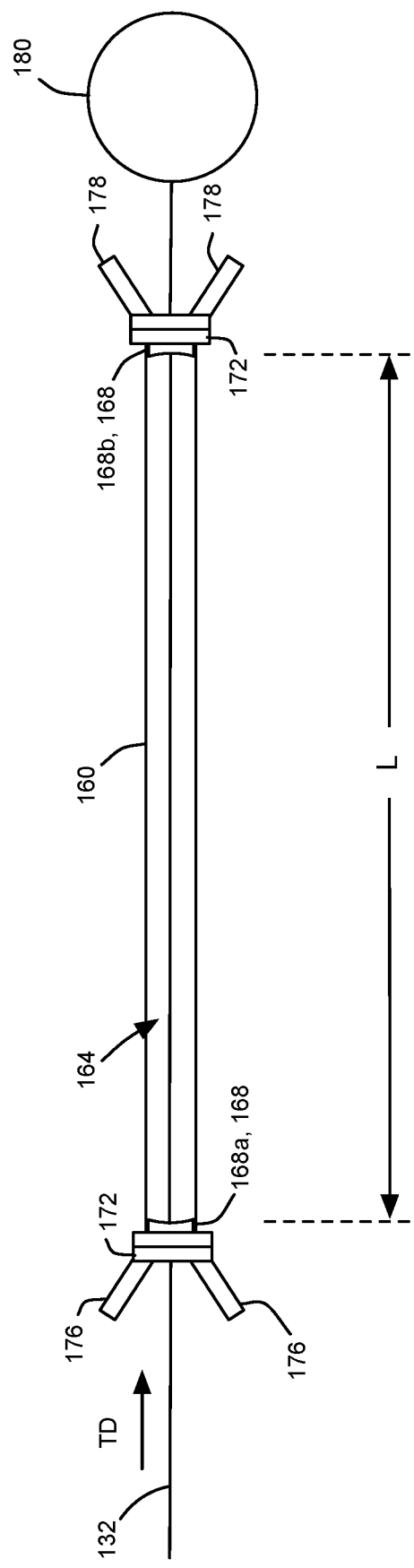
FIG. 3 is a schematic diagram of the resonant cavity of the resonant cavity system of FIG. 2.

Now referring to FIGS. 2 and 3, the ring-down chamber 160 is an elongated tube defining a resonant cavity referred to as a ring-down cavity 164 therein. A front cavity mirror 168a and a rear cavity mirror 168b (alternatively referred to herein as cavity mirrors 168) are positioned at longitudinal ends of the ring-down cavity 164. The cavity mirrors 168 are highly reflective, both to light directed to the cavity mirrors 168 from outside of the ring-down cavity 164 and directed to the cavity mirrors 168 within the ring-down cavity 164. As a result, a fraction of the working beam 132 is directed at the front cavity mirror 168a, about 0.1%, passes through the front cavity mirror 168a, and enters the ring-down cavity 164, and the majority of the working beam 132, about 99.9% is reflected back towards the mirror 156 while the ring-down cavity 164 is not frequency matched to the working beam 132. The light reflected back towards the lasers 104, 108 is frequency shifted by the AOMs, 148, 140 so that the wavelength of the reflected light does not interfere with the generation of the working beam 132 in the cavity of the lasers 104, 108.

The cavity mirrors 168 are mounted on mirror mounts 172 that are actuatable to adjust the positioning and orientation of the cavity mirrors 168. In particular, the front cavity mirror 168a towards the front of the ring-down cavity 164 is mounted on a mirror mount 172 that is actuatable via three mechanized micrometers 176. The rear cavity mirror 168b towards the rear of the ring-down cavity 164 is mounted on a mirror mount 172 that is actuatable via three piezo-electric transducers 178 that can be manually adjusted for optical alignment or with a piezo that allows them to be adjusted further with a piezo driver.

The angle of each of the cavity mirrors 168 can be changed to sufficiently align them so that when a light beam enters the ring-down cavity 164, the light beam does not deviate. If one of the cavity mirrors 168 is askew, then some of the light gets reflected to the side of the ring-down cavity 164, intensity of the light is lost, high-order modes result, amongst other things. The micrometers 176 and the piezo-electric transducers 178 can also be singly or simultaneously tuned to change the length, L, of the ring-down cavity 164 without affecting the angle alignment. This allows for the tuning of the ring-down cavity 164 so that the ring-down cavity 164 resonates at the frequency of the light that is entering the ring-down cavity 164.

The focusing lens 152 focuses the laser light to match the optical mode of the ring-down cavity 164, so that the minimum waist of the beam is positioned at the same place as the minimum beam waist of the ring-down cavity 164. The position of the focusing lens 152 can be adjusted to match the optical mode of a range of laser wavelengths. In other embodiments, two or more lenses can be employed to mode match.

A liquid nitrogen-cooled detector 180 is positioned behind the rear cavity mirror 168b to receive light escaping through it. The detector 180 is a photosensor that measures the intensity of the light that escapes the ring-down cavity 164 via the rear cavity mirror 168b. Other types of sensors for measuring the intensity of the escaping light can be used in place of the detector 180.

Gaseous samples are loaded into the ring-down cavity 164 by a sample loading system 192. The sample loading system 192 can include sample storage devices, such as one or more thermal desorption tubes, that are used to collect and deliver the gaseous samples for testing. Other types of sample storage devices can be employed, such as sample bags or cylinders. In another exemplary mode of operation, the sample loading system 192 can load samples directly from a subject. In a particular example, the gaseous samples are human breath samples collected from patients. The particulars of how samples are loaded into and unloaded from the ring-down cavity 164 are not described herein, as it would be readily apparent to a person skilled in the art that there are a number of manners in which samples can be loaded into and unloaded from the ring-down cavity 164.

As noted, the length, L, of the cavity 164 between the mirrors 168a, 168b can be controlled by translation of the rear cavity mirror 168b via the piezo-electric transducers 178. In addition, the pitch of the rear cavity mirror 168b can be controlled via the piezo-electric transducers 178, but, in this configuration, the pitch of the rear cavity mirror 168b is held constant.

The piezo-electric transducers 178 are controlled by a frequency-matching system 196 that matches the length L of the ring-down cavity 164 to the frequency, and thus the wavelength, of the light from the selected one of the lasers 104, 108 being operated. It is noted that frequency and wavelength may be used interchangeably herein. During operation, the frequency of the selected one of the lasers 104, 108 being operated can drift, causing the ring-down cavity 164 to become out of tune with the light from the selected laser 104, 108. Destructive interference results and makes it difficult to build up a desired level of light for performing cavity ring-downs.

Conventional resonant cavity systems modulate the frequency of the laser to match a cavity of a fixed length using a method such as the Pound-Drever-Hall technique. In contrast, a different approach is used by the CRDS system 100, wherein the light escaping from the ring-down cavity 164 is monitored to determine how to adjust the length L of the ring-down cavity 164 to match the frequency of the laser. The determined adjustment is then used to actuate the piezo-electric transducers 178 and the rear cavity mirror 168b towards a position at which the cavity length L corresponds to the frequency/wavelength of the laser.

The frequency-matching system 196 includes a lock-in amplifier 200 that receives a signal of the monitored intensity from the detector 180. A function generator 204 generates a reference oscillating signal. This oscillating signal is received by a phase shifter 208 of the lock-in amplifier 200 that then shifts the oscillating signal to be in phase with the reflected or transmitted light signal. The phase-shifted oscillating signal and the signal from the detector 180 are frequency mixed by a frequency mixer 212, referred to more simply as a mixer. The mixer 212 outputs a mixed signal which is then filtered by a low-pass filter 216 to remove noise and higher-order frequencies, and then amplified via a servo amplifier 220. The filtered and amplified signal gives a measure of how far the light from the selected laser 104, 108 and the ring-down cavity 164 are off of resonance from each other. A proportional-integral-derivative ("PID") controller 224 processes the filtered and amplified signal to provide a closed loop and an error correction voltage to be applied to the oscillating signal from the function generator 204. The error correction voltage is then added to the oscillating signal from the function generator 204 by an adder 228. The added voltage is then used to drive the piezo-electric transducers 178 to move the rear cavity mirror 168b to frequency match the ring-down cavity 164 with the laser light.

Referring now to FIGS. 2 and 3, once the gaseous sample is loaded in the ring-down cavity 164, the selected laser 104, 108 being operated is tuned to a specific wavelength and its light is directed through the first optical modulator 140, reflected by the mirror 144, through the second optical modulator 148, and reflected by the mirror 152 towards the ring-down chamber 160. The optical modulators 140, 148 attenuate the working beam 132 somewhat to modulate its intensity.

When the working beam 132 reaches the front cavity mirror 168a, a fraction, about 0.1%, penetrates the front cavity mirror 168a to enter the ring-down cavity 164. The majority of the working beam, about 99.9%, is initially reflected back along the same path towards the selected laser 104 or 108 being operated, and is frequency shifted by the AOMs 48, 40 so that the reflected light substantially does not interfere with the generation of the working beam 132.

Initially, the ring-down cavity 164 is not illuminated. In order to enable "filling" of the ring-down cavity 164 with light, the length of the ring-down cavity 164 must match the frequency of the light so that there is constructive in the ring-down cavity 164, and so that the front cavity mirror 168a effectively no longer reflects the beam 132 from the laser 104 or 108. Light then enters the ring-down cavity 164 and, as the majority of the light in the ring-down cavity 164 is reflected between the two cavity mirrors 168, the amount, or power, of light in the ring-down cavity 164 starts increasing as further light is introduced from outside via the working beam 132. A certain fraction of the light leaks out past the cavity mirrors 168.

Light exiting the ring-down cavity 164 via the rear cavity mirror 168b and monitored by the detector 180 is used by the frequency-matching system 196 to adjust the cavity length L of the ring-down cavity 164 so that the laser light can efficiently enter the ring-down cavity 164.

Now with reference to FIGS. 2 to 5A, the general method 300 of frequency-matching the ring-down cavity 164 with the laser light is shown. The method 300 commences with the monitoring of the intensity signal from the detector 180 (310). During operation, the detector 180 is configured to continuously generate a signal corresponding to the intensity of the light received. In its current pose, the length L of the path of the light between the front and rear cavity mirrors 168a, 168b is shown. A resonance length RL equal to a multiple of half the wavelength of the light is also shown. The rear cavity mirror 168b is then actuated in a direction so that directionality of any error correction can be determined (320). In one configuration, as is shown in FIG. 5A, the rear cavity mirror 168b is moved (translated in this scenario) a small distance in one direction and then back in another direction opposite the first direction; that is, oscillated or vibrated. In another configuration, the rear cavity mirror 168b can be moved a small distance in one direction without initially moving the rear cavity mirror 168b back. Other manners of moving the rear cavity mirror 168b to determine the error correction and the directionality thereof will occur to those skilled in the art.

Next, an error correction to be applied is determined for the rear cavity mirror 168b (330). As previously described, the signal from the detector 180 is mixed with a phase-shifted oscillating signal from the function generator 204, and the resulting mixed signal is then filtered via the low-pass filter 216 and amplified via the servo amplifier 220. The PID controller 224 processes the filtered signal to generate an error correction voltage to be combined with the oscillating signal from the function generator 204 by the adder 228. This combined signal is then applied to the piezo-electric transducers 178 to translate the rear cavity mirror 168b verges to a pose at which the cavity length L of the ring-down cavity 164 is frequency matched with the resonance length RL of the laser as shown in FIG. 5B; that is, the cavity length L is a multiple of a half of the wavelength of the light from the laser.

It is then determined if a repeat condition is met (360). During the course of operation, the frequency of the laser light can drift. Accordingly. it can be desirable to repeatedly determine error corrections to make the cavity length frequency match the light. In one configuration, the rear cavity mirror 168b can be actuated continuously back and forth (i.e., oscillated or vibrated) within a very small range centered on the position at which the cavity length L is matched to the frequency of the laser light, and small adjustments can be continuously made. In this configuration, the repeat condition would be continuously met. In another configuration, the rear cavity mirror 168b can be actuated intermittently based on regular time intervals or another factor, such as the expected drift of the laser frequency based on how much drift was last detected, the expected drift range of the laser, etc. Here, the repeat condition would depend on the selected factor or factors. In yet another configuration, the rear cavity mirror 168b is actuated continuously in between ring-down events, and is not oscillated during ring-down events.

If the repeat condition is determined to be met at 360, the method returns to 320, wherein the rear cavity mirror 168b is actuated to determine the directionality of the error correction to be made.

In this manner, the ring-down cavity 164 can be maintained in frequency match with the laser light continually.

The error correction technique used is similar to the Pound-Drever-Hall technique. A symmetrical resonator is used, of which the complex reflection coefficient is given by:

$$F(\omega, L) = \frac{r\left(\exp\left(\frac{i2\omega L}{c}\right)\right)}{1 - r^2 \exp\left(\frac{i2\omega L}{c}\right)}, \quad (1)$$

where r is the reflection coefficient of each mirror, w is the angular frequency of the incoming field, and L is the length of the ring-down cavity 164.

In a conventional laser beam modulation approach using the Pound-Drever-Hall technique, the laser beam is assumed to have an angular frequency $\omega_0$, whose phase is modulated at frequency $\Omega$, such as $$E_{inc} = E_0 \exp(i(\omega_0 t - \beta \cos \Omega t)), \quad (2)$$

where β is the amplitude of the phase modulation. One can define the instantaneous laser frequency as the derivative of the phase with respect to time:

$$\omega(t) = \frac{d}{dt}(\omega_0 t - \beta \cos \Omega t) = \omega_0 + \beta \Omega \sin \Omega t. \quad (3)$$

If the modulation frequency, $\Omega$, is not too high, the reflected power, $P_{ref}$, is given by:

$$P_{ref}(t) \cong P_0 |F(\omega(t), L)|^2 \quad (4)$$

where $P_0$ is the incident power and the symbol $|F(\omega(t),L)|^2$ is the squared modulus of the reflection coefficient; i.e., the instantaneous reflectance. The value of L is fixed. For a small enough modulation frequency, one can make a Taylor expansion around the frequency $\omega_0$ as follows:

$$P_{ref}(t) \cong P_{ref}(\omega, L) + P_0 \frac{\delta |F(\omega, L)|^2}{\delta \omega} \Big|_{\omega=\omega_0} \beta \Omega \sin \Omega t. \quad (5)$$

The periodic signal at the modulation frequency $\Omega$ has an in-phase value given by:

$$\varepsilon_{\omega(t)} \cong P_0 \frac{\delta |F(\omega, L)|^2}{\delta \omega} \Big|_{\omega=\omega_0} \beta \Omega. \quad (6)$$

The signal $\varepsilon_{\omega(t)}$ is a good error signal because $\varepsilon_{\omega(t)}$ goes through zero when $\omega_0$ matches a resonance frequency, $\omega_p$, of the ring-down cavity 164. Further, $\varepsilon_{\omega(t)}$ is an odd function of $\omega_0 - \omega_p$, which means that the sign of $\varepsilon_{\omega(t)}$ differs according to the sign of $\omega_0 - \omega_p$.

In contrast, the CRDS system 100 modulates the cavity length to frequency match the laser frequency. The length L of the ring-down cavity 164 is modulated as a function of time:

$$L(T) = L_0 + \delta L \sin \Omega t, \quad (7)$$

while the laser frequency $\omega_0$ is fixed. Similarly to the laser modulation calculations above, if the amplitude of modulation, $\delta L$, is small, the reflected power can be written as $$P_{ref}(t) = P_0 |F(\omega_0, L(f))|^2 \cong P_{ref}(\omega_0, L_0) + \frac{dP_{ref}}{dL}(\delta L)\sin \Omega t \quad (8)$$

$$P_{ref}(t) \cong P_{ref}(\omega_0, L_0) + P_0 \frac{\delta |F(\omega, L)|^2}{\delta L} \Big|_{L=L_0} (\delta L)\sin \Omega t. \quad (9)$$

As a result, the error signal is now given by:

$$\varepsilon_{L(t)} \cong P_0 \frac{\delta |F(\omega_0, L(t))|^2}{\delta L} \Big|_{L=L_0} (\delta L). \quad (10)$$

For the same reasons as above, the signal $\varepsilon_{L(t)}$ is a good error signal, as $\varepsilon_{L(t)}$ goes through zero when L matches a resonance condition of the ring-down cavity 164; that is, L=Lp. Further, $\varepsilon_{L(t)}$ is an odd function of $L-L_p$, which means that the sign of $\varepsilon_{L(t)}$ changes according to the sign of $L-L_p$ in the vicinity of $L \approx L_p$, thus indicating the directionality of the correction required to move the rear cavity mirror 168b to a position where the length L of the ring-down cavity 164 matches the wavelength/frequency of the light entering the ring-down cavity 164.

Now comparing the signal of conventional laser modulation with that from cavity length modulation, it is noted that $$\frac{\partial |F(\omega, L(t))|^2}{\partial L}\bigg|_{L=L_0} = \frac{\partial |F(\omega(t), L))|^2}{\partial \omega}\bigg|_{\omega=\omega_0} \times \frac{\omega_0}{L_0}. \quad (11)$$

Hence, $$\varepsilon_{L(t)} \cong P_0 \frac{\delta |F(\omega_0, L_0)|^2}{\delta \omega}\left(\frac{\delta L}{L_0}\right)\omega_0. \quad (12)$$

The error ratio is given by:

$$R \equiv \varepsilon_{L(t)}/\varepsilon_{\omega(t)} \cong \frac{\left(\frac{\delta L}{L_0}\right)\omega_0}{\beta\Omega} \quad (13)$$

In an example, $L_0=30$ cm and $\lambda_0=10$ µm are used. If it is desired to obtain, with a vibrating ring-down cavity 164 (i.e., having an oscillating rear cavity mirror 168b), the same error signal as a phase modulation with $\beta=0.1$ rad and $\Omega=10^6$ rad/s, then the required vibration amplitude is $\delta L=0.16$ nm. With high reflectivity mirrors like R=0.9986, the obtained finesse is about $$\text{Finesse} = \frac{\pi\sqrt{R}}{1-R} = 2240. \quad (14)$$

Moreover, the scanning range between consecutive modes is $\Delta L=\lambda_0/2$. Therefore, one has a tolerance of roughly $$\Delta x = \frac{\lambda/2}{\text{Finesse}} \approx 2 \text{ nm} \quad (15)$$

in order to stay inside the resonance. This is significantly larger than the required vibration amplitude that would give a suitable error signal.

Figure 6:
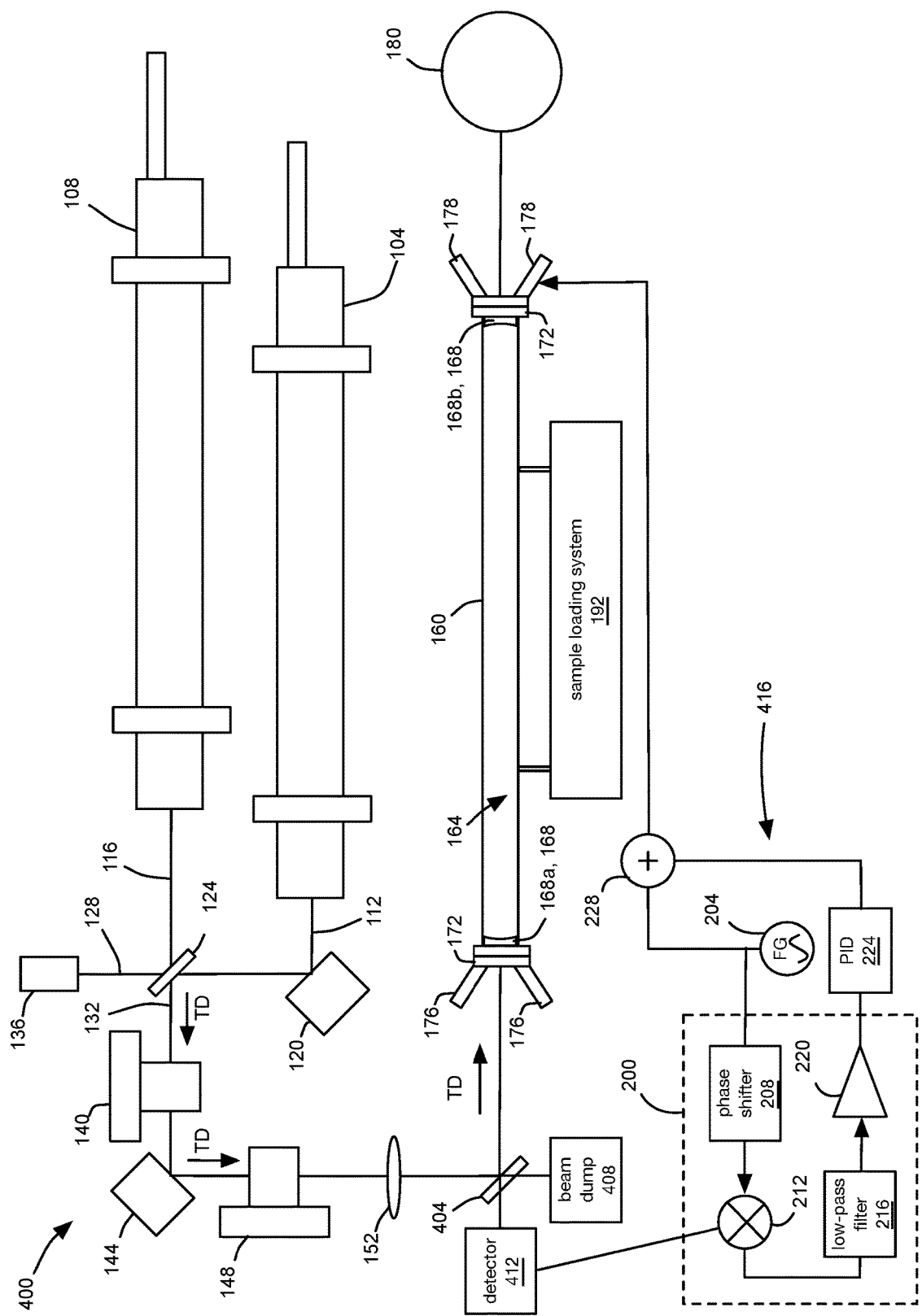
FIG. 6 is a schematic diagram of a resonant cavity system according to another embodiment.

FIG. 6 shows a CRDS system 400 in accordance with another embodiment. In this embodiment, a signal from a detector positioned to register light reflected from the front cavity mirror 168a or escaping from the ring-down cavity 164 via the front cavity mirror 168a is used to frequency-match the ring-down cavity 164 with the laser light frequency. Instead of reflecting the laser beam via a mirror after the focusing lens 152, a beam splitter 404 is used to reflect a portion of the working beam 132 towards the front cavity mirror 168a and into the ring-down cavity 164. A portion of the working beam 132 passes through the beam splitter 404 and is received by a beam dump 408.

Some of the light directed towards the front cavity mirror 168a is reflected back towards the beam splitter 404. Additionally, a fraction of the light from the ring-down cavity 164 may escape via the front cavity mirror 168a and travel to the beam splitter 404. Some of the light directed towards the beam splitter 404 from the front cavity mirror 168a is reflected towards the AOMs 148, 140, which frequency shift the light to avoid interference with the light being generated by the lasers 104, 108.

The remainder of the light directed towards the beam splitter 404 passes through and is registered by a detector 412. The detector 412 is a photosensor that measures the intensity of the light received, much like the detector 180. The detector 412 generates a signal corresponding to the intensity of the light detected and transmits it to the lock-in amplifier 200 of a frequency-matching system 416. Much like the frequency-matching system 196 of the embodiment illustrated in FIGS. 2 and 3, the frequency-matching system 416 generates an error correction voltage that is applied to the piezo-electric transducers 178 coupled to the rear cavity mirror 168b to actuate it towards a position at which the ring-down cavity 164 is in resonance with the working beam 132.

Figure 4:
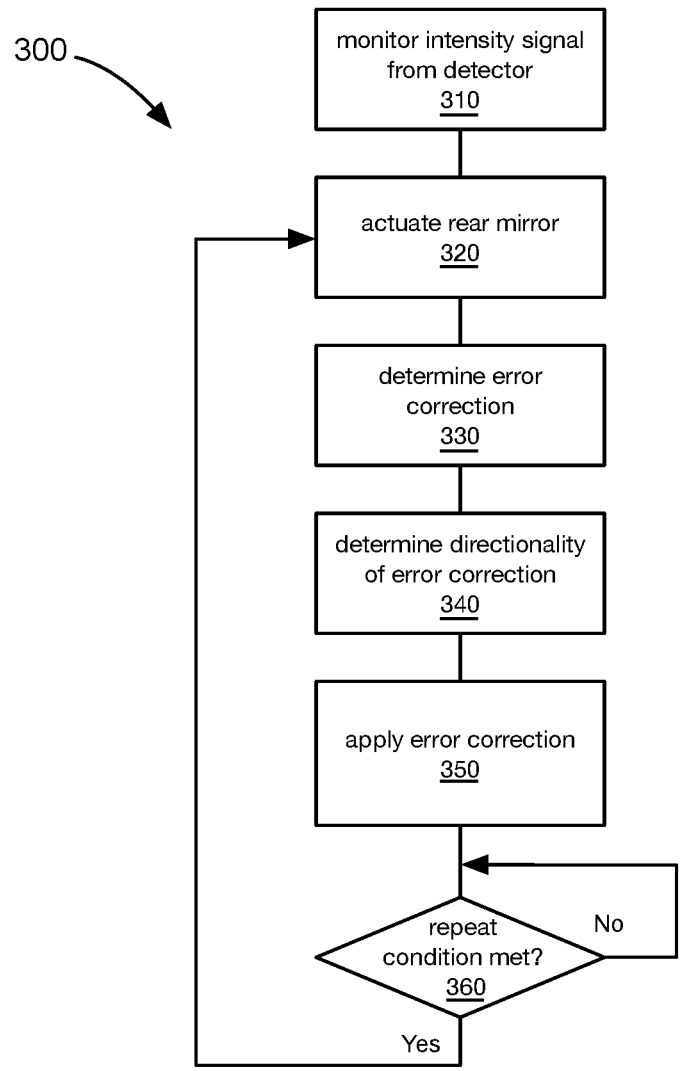
FIG. 4 is a flow chart of the general method for frequency locking in the resonant cavity system of FIG. 2.

The same method 300 as described with respect to FIG. 4 can be employed to frequency match the ring-down cavity 164 with the light.

While in the above-described embodiments, the pose of only the rear cavity mirror 168b is adjusted to accommodate for changes in the detected frequency of the laser, in other embodiments, the front cavity mirror 168b or both the front and rear cavity mirrors 168a, 168b can be moved to change the cavity length L of the ring-down cavity 164.

Figure 7:
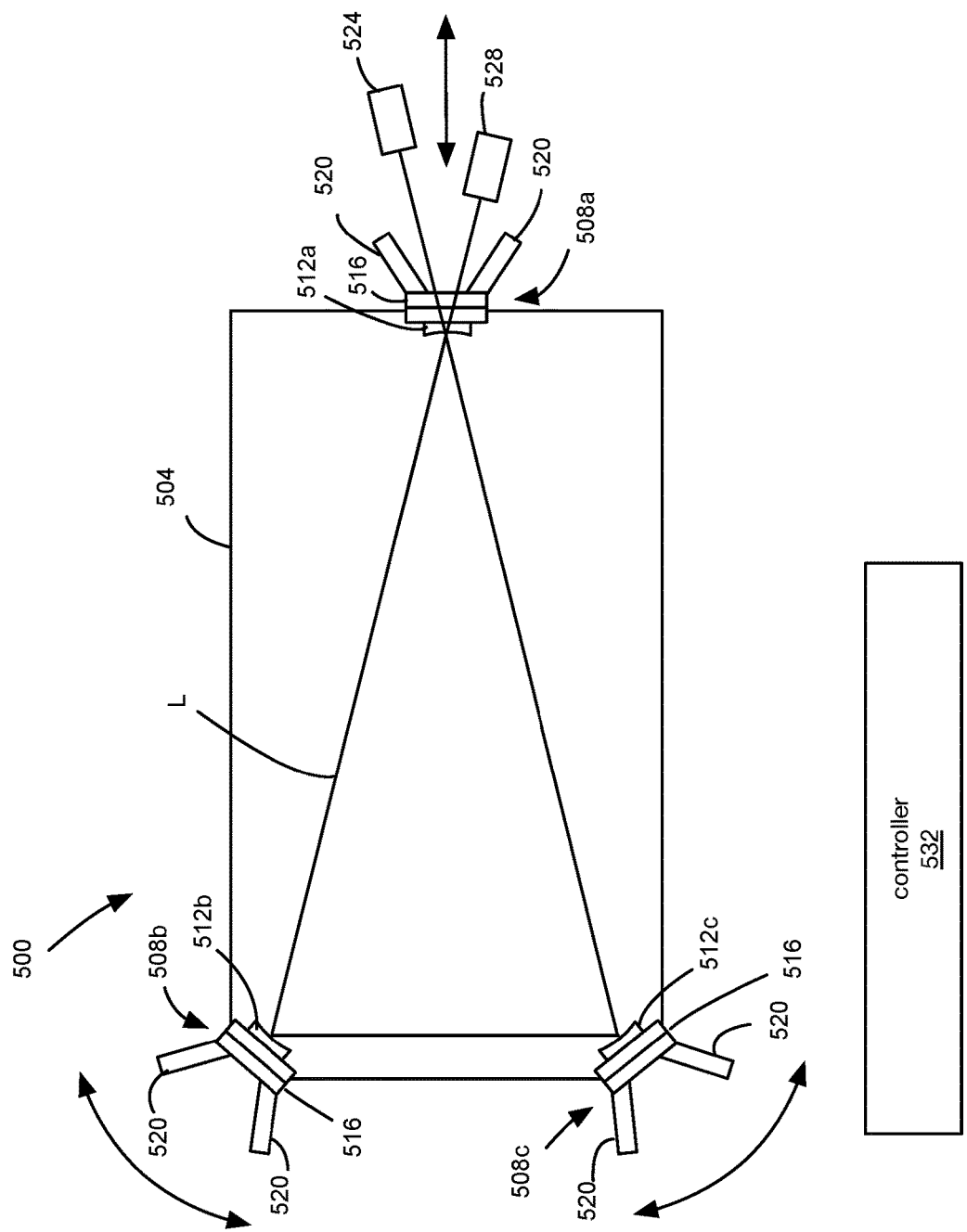
FIG. 7 is a schematic diagram of a resonant cavity system according to a further embodiment.

FIG. 7 shows a resonant cavity system 500 in accordance with another embodiment. In this embodiment, a resonance cavity 504 has three mirrors defining a path along which light is reflected. A set of three mirror assemblies 508a, 508b, 508c (alternatively referred to hereinafter as mirror assemblies 508) each include a mirror 512a, 512b, 512c respectively (alternatively referred to hereinafter as mirrors 512). The mirrors 512 are mounted on mirror mounts 516. The pose (that is, the position and the orientation) of each of the mirrors 512 is controllable by a set of piezo-electric transducers 520. A laser 524 is positioned to direct a laser beam at the mirror 512a to enter the resonance cavity 504. The mirrors 512a, 512b, 512c are positioned and oriented to reflect the laser light along a path having a length L within the resonant cavity 504. Light escaping through the mirror 512a is received by a detector 528, which transmits a signal corresponding to the intensity of the light detected to a controller 532. The set of piezo-electric transducers 520 for each mirror 512 are controlled by the controller 532. The controller 532 includes the same functionality as the frequency-matching system 196 of FIG. 2.

During operation, the controller 532 actuates the mirror 512a via the piezo-electric transducers 520 to oscillate slightly. Concurrently, the controller 532 actuates the mirrors 512b, 512b via their corresponding piezo-electric transducers 520 to reorient to accommodate the change in position of the mirror 512a so that the path of the light in the resonant cavity 504 is maintained. As a result, both an error correct and its directionality can be determined by the controller 532.

To compensate for detected changes in the frequency of the light from the laser 524, the mirror 512a can be moved linearly towards or away from the other two mirrors 512b, 512c, and a corresponding change to the orientation of the mirrors 512b, 512c can be made to maintain the path of the light in the resonant cavity 504.

In other configurations, the controller 532 can move the mirror 512a slightly in one direction to determine the error correction and its directionality, or can move the mirror 512a slightly in any other manner to obtain the error correction and its directionality. Further, instead of reorienting the mirrors 512b, 512c in response to a translation of the mirror 512a, mirrors 512b and 512c can be also translated to maintain a continuous reflected path for the light in the resonant cavity 504.

Although specific advantages have been enumerated above, various embodiments may include some, none, or all of the enumerated advantages.

Persons skilled in the art will appreciate that there are yet more alternative implementations and modifications possible, and that the above examples are only illustrations of one or more implementations. The scope, therefore, is only to be limited by the claims appended hereto.

LIST OF REFERENCE NUMERALS 20 resonance cavity system
24 laser
28 laser beam
32 phase modulator
36 optical isolator
40 resonance chamber
44a front mirror
44b rear mirror
48 cavity
52 beam dump
56 photo-detector
60 mixer
64 function generator
68 phase shifter
72 low-pass filter
76 servo amplifier
100 CRDS system
104 CO2 laser
108 carbon-13 O2 laser
112 first laser beam
116 second laser beam
120 mirror
124 beam splitter
128 sampling beam
132 working beam
136 fast infrared detector
140 first optical modulator
144 mirror
148 second optical modulator
152 focusing lens
156 mirror
160 ring-down chamber
164 ring-down cavity
168 cavity mirror
168a front cavity mirror
168b rear cavity mirror
172 mirror mounts
176 mechanized micrometer
178 piezo-electric transducer
180 liquid nitrogen-cooled detector
192 sample loading system
196 frequency-matching system
200 lock-in amplifier
204 function generator
208 phase shifter
212 mixer
216 low-pass filter
220 servo amplifier
224 PID controller
228 adder
300 method
310 monitor intensity signal from detector
320 actuate rear mirror
330 determine error correction
340 determine directionality of error correction
350 apply error correction
360 repeat condition met?
400 CRDS system
404 beam splitter
408 beam dump
412 detector
416 frequency-matching system
500 resonant cavity system
504 resonance cavity
508, 508a, 508b, 508c mirror assembly
512, 512a, 512b, 512c mirror
516 mirror mount
520 piezo-electric transducer
524 laser
528 detector
532 controller
L length
RL resonance length

What is claimed is:

1. A method for frequency matching a resonant cavity, comprising:
receiving light in a resonant cavity, the resonant cavity having at least a first mirror and a second mirror defining a path along which light is reflected, one or both of the first mirror and the second mirror at least partially permitting light from the resonant cavity to pass therethrough, at least the second mirror being actuatable by transmitting a signal to an actuator to vary the length of the path of the resonant cavity;
modulating the signal transmitted to the actuator to regularly oscillate the second mirror to alternatingly move towards and away from the first mirror;
monitoring an intensity of the light exiting or reflecting from the resonant cavity via the at least one of the first mirror and the second mirror;
determining an error correction from the monitored intensity of the light from the resonant cavity; and
actuating the second mirror, at least partially based on the error correction, towards a pose relative to the first mirror at which a frequency of the light is in resonance with the length of the path.

2. The method of claim 1, wherein the first mirror is positioned at a first end of the resonant cavity, the second mirror is positioned at a second end of the resonant cavity, and the path is defined between the first mirror and the second mirror.

3. The method of claim 1, wherein the light is infrared or near-infrared.

4. The method of claim 1, wherein the second mirror is oscillated to move alternatingly towards and away from the first mirror to determine a directionality of an error correction to be applied to the second mirror.

5. The method of claim 4, wherein the second mirror is constantly oscillated by the modulating to alternatingly move towards and away from the first mirror to determine the error correction.

6. The method of claim 4, wherein the second mirror is intermittently oscillated by the modulating to move alternatingly towards and away from the first mirror to determine the error correction.

7. The method of claim 4, wherein the second mirror is alternatingly unactuated when a ring-down event is occurring and oscillated in between ring-down events by the modulating.

8. The method of claim 4, further comprising receiving the light in the resonant cavity via the first mirror.

9. The method of claim 8, wherein the monitoring is performed by a photosensor positioned to monitor light exiting the resonant cavity via the second mirror.

10. The method of claim 8, wherein the monitoring is performed by a photosensor positioned to monitor light reflected from the first mirror and/or exiting the resonant cavity via the first mirror.

11. A system for frequency matching a resonant cavity, comprising:

a resonant cavity having at least a first mirror and a second mirror defining a path along which light is reflected, one or both of the first mirror and the second mirror at least partially permitting light from the resonant cavity to pass therethrough, at least the second mirror being actuatable to vary the length of the path of the resonant cavity;

a light intensity meter configured to monitor an intensity of the light exiting or reflecting from the resonant cavity via the at least one of the first mirror and the second mirror;

a mirror actuator system configured to actuate the second mirror;

a signal generator configured to generate a signal to cause the mirror actuator system to actuate the second mirror to a pose relative to the first mirror;

a modulation generator configured to modulate the signal transmitted to the mirror actuator system to regularly oscillate the second mirror to alternatingly move towards and away from the first mirror; and a logic unit configured to determine an error correction from the intensity of the light monitored by the light intensity meter, wherein the signal generator is configured to modify the signal sent to the mirror actuator system, at least partially based on the error correction, to actuate the second mirror towards a pose relative to the first mirror at which a frequency of the light is in resonance with the length of the path.

12. The system of claim 11, wherein the mirror actuator system comprises at least one piezo-electric actuator connected to the logic unit.

13. The system of claim 11, wherein the first mirror is positioned at a first end of the resonant cavity, the second mirror is positioned at a second end of the resonant cavity, and the path is defined between the first mirror and the second mirror.

14. The system of claim 11, wherein the light is infrared or near-infrared.

15. The system of claim 11, wherein the mirror actuation system is configured, in response to the signal modulated by the modulation generator, to oscillate the second mirror alternatingly towards or away from the first mirror to determine a directionality of an error correction to be applied to the signal.

16. The system of claim 15, wherein the mirror actuation system is configured to constantly oscillate the second mirror alternatingly towards and away from the first mirror to determine the error correction in response to receiving the signal modulated by the modulation generator.

17. The system of claim 15, wherein the mirror actuation system is configured to intermittently oscillate the second mirror alternatingly towards and away from the first mirror to determine the error correction in response to receiving the signal modulated by the modulation generator.

18. The system of claim 15, wherein the mirror actuation system, in response to receiving the signal modulated by the modulation generator, is configured to stop oscillating the second mirror when a ring-down event is occurring and oscillate the second mirror in between ring-down events.

19. The system of claim 15, further comprising a light system configured to deliver the light into the resonant cavity via the first mirror.

20. The system of claim 19, further comprising a photosensor positioned to monitor light exiting the resonant cavity via the second mirror.

21. The system of claim 19, further comprising a photosensor positioned to monitor light reflected from the first mirror and/or exiting the resonant cavity via the first mirror.

* * * * *